United States Patent
Sills et al.

(10) Patent No.: US 9,397,145 B1
(45) Date of Patent: Jul. 19, 2016

(54) MEMORY STRUCTURES AND RELATED CROSS-POINT MEMORY ARRAYS, ELECTRONIC SYSTEMS, AND METHODS OF FORMING MEMORY STRUCTURES

(71) Applicant: Micron Technology, Inc., Boise, ID (US)

(72) Inventors: Scott E. Sills, Boise, ID (US); D. V. Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/712,241

(22) Filed: May 14, 2015

(51) Int. Cl.
  *G11C 5/02* (2006.01)
  *H01L 27/24* (2006.01)
  *H01L 45/00* (2006.01)
  *G11C 13/00* (2006.01)

(52) U.S. Cl.
  CPC ........ *H01L 27/2481* (2013.01); *G11C 13/0002* (2013.01); *H01L 45/1246* (2013.01); *H01L 45/1253* (2013.01); *H01L 45/145* (2013.01); *H01L 45/16* (2013.01); *G11C 5/025* (2013.01); *H01L 27/24* (2013.01); *H01L 45/06* (2013.01)

(58) Field of Classification Search
  CPC .............. H01L 27/11578; H01L 45/06; H01L 27/0207; H01L 27/24; G11C 13/0002; G11C 2213/71; G11C 5/02; G11C 5/06; G11C 5/025
  USPC ........................ 365/51, 148, 163, 63; 257/2–5
  See application file for complete search history.

(56) References Cited

U.S. PATENT DOCUMENTS

| | | | |
|---|---|---|---|
| 6,420,784 B2 | 7/2002 | Hu et al. | |
| 7,842,558 B2 | 11/2010 | Juengling | |
| 8,530,939 B2 | 9/2013 | Sills et al. | |
| 8,541,765 B2 | 9/2013 | Marsh et al. | |
| 8,598,562 B2 | 12/2013 | Sills | |
| 8,652,909 B2 | 2/2014 | Sills et al. | |
| 8,958,228 B2 * | 2/2015 | Samachisa | G11C 13/0002 365/51 |
| 2005/0270830 A1 | 12/2005 | Tuttle | |
| 2014/0361239 A1 | 12/2014 | Ramaswamy et al. | |

* cited by examiner

*Primary Examiner* — David Lam
(74) *Attorney, Agent, or Firm* — TraskBritt

(57) ABSTRACT

A memory structure comprises first conductive lines extending in a first direction over portions of a base structure, storage element structures extending in the first direction over the first conductive lines, isolated electrode structures overlying portions of the storage element structures, select device structures extending in a second direction perpendicular to the first direction over the isolated electrode structures, second conductive lines extending in the second direction over the select device structures, additional select device structures extending in the second direction over the second conductive lines, additional isolated electrode structures overlying portions of the additional select device structures, additional storage element structures extending in the first direction over the additional isolated electrode structures, and third conductive lines extending in the first direction over the additional storage element structures. Cross-point memory arrays, electronic systems, and related methods are also described.

24 Claims, 10 Drawing Sheets

MEMORY STRUCTURES AND RELATED CROSS-POINT MEMORY ARRAYS, ELECTRONIC SYSTEMS, AND METHODS OF FORMING MEMORY STRUCTURES

TECHNICAL FIELD

Embodiments of the disclosure relate to the field of semiconductor device design and fabrication. More specifically, embodiments of the disclosure relate to memory structures, and to related cross-point memory arrays, electronic systems, and methods of forming memory structures.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

One example of a semiconductor device is a memory device. Memory devices are generally provided as internal integrated circuits in computers or other electronic devices. There are many types of memory including, but not limited to, random-access memory (RAM), read only memory (ROM), dynamic random access memory (DRAM), synchronous dynamic random access memory (SDRAM), flash memory, and resistance variable memory. Non-limiting examples of resistance variable memory include resistive random access memory (RRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

Some memory devices include memory arrays exhibiting memory cells arranged in a cross-point architecture including conductive lines (e.g., access lines, such as word lines) extending perpendicular (e.g., orthogonal) to additional conductive lines (e.g., data lines, such as bit lines). The memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells. Select devices can be used to select particular memory cells of a 3D memory array. Challenges related to memory device fabrication include decreasing the size of a memory device, increasing the storage density of a memory device, and reducing fabrication costs.

A need, therefore, exists for new memory structures, such as 3D cross-point memory arrays, as well as for electronic systems including the memory structures, and simple, cost-efficient methods of forming memory structures.

BRIEF DESCRIPTION OF THE SEVERAL VIEWS OF THE DRAWINGS

FIGS. 1 through 8, including

DETAILED DESCRIPTION

Figure 1:
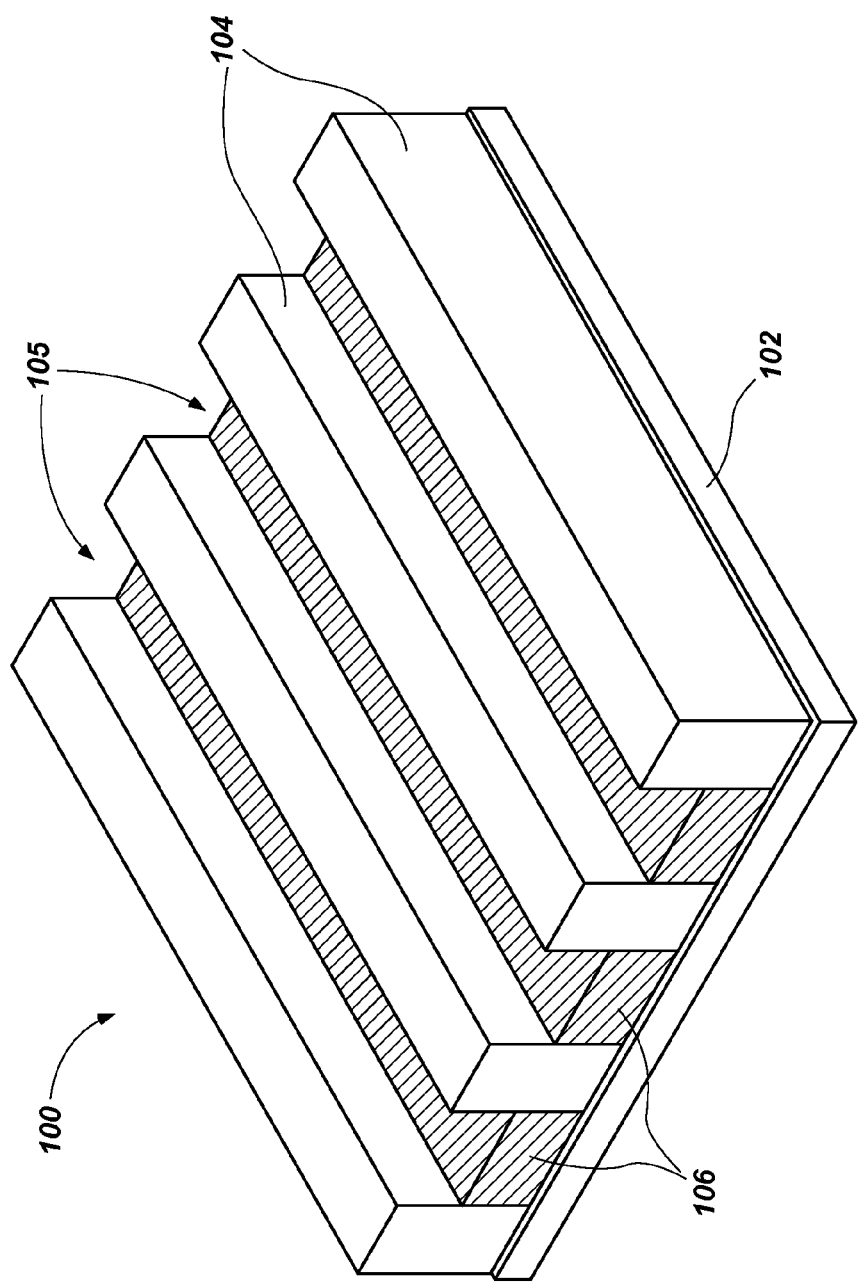

Memory structures are disclosed, as are three-dimensional cross-point memory arrays, electronic systems, and methods of forming memory structures. In some embodiments, a memory structure includes first conductive lines (e.g., access lines, such as word lines) extending in a first direction over portions of a base structure. Storage element structures may extend over the first conductive lines in the first direction. Optionally, buffer structures may be located between the first conductive lines and the storage element structures and may extend in the first direction. Isolated electrode structures may overlie portions of the storage element structures. Select device structures may extend over the isolated electrode structures in a second direction perpendicular to the first direction. Second conductive lines (e.g., data lines, such as bit lines) may extend over the select device structures in the second direction. Additional select device structures may extend over the second conductive lines in the second direction. Additional isolated electrode structures may overlie portions of the additional select device structures. Additional storage element structures may extend over the additional isolated electrode structures in the first direction. Third conductive lines (e.g., additional access lines, such as additional word lines) may extend over the additional storage element structures in the first direction. Optionally, additional buffer structures may be located between the third conductive lines and the additional storage element structures and may extend in the first direction. The structures and methods of the disclosure may facilitate increased feature density, providing enhanced performance in devices (e.g., memory devices) and systems (e.g., electronic systems) that rely on high feature density.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device (e.g., a memory device). The memory structures described below do not form a complete semiconductor device. Only those process acts and structures necessary to understand the embodiments of the disclosure are described in detail below. Additional acts to form the complete semiconductor device from the memory structures may be performed by conventional fabrication techniques. Also note, any drawings accompanying the application are for illustrative purposes only, and are thus not drawn to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or may be undoped.

As used herein, the term "configured" refers to a size, shape, material composition, and arrangement of one or more of at least one structure and at least one apparatus facilitating operation of one or more of the structure and the apparatus in a pre-determined way.

As used herein, the singular forms "a," "an," and "the" are intended to include the plural forms as well, unless the context clearly indicates otherwise.

As used herein, "and/or" includes any and all combinations of one or more of the associated listed items.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

FIGS. 1 through 8, are simplified perspective views illustrating embodiments of a method of forming a memory structure, such as a 3D cross-point memory array for a memory device (e.g., a resistance variable memory device, such as a RRAM device, a CBRAM device, an MRAM device, a PCM memory device, a PCRAM device, an STTRAM device, an oxygen vacancy-based memory device, and/or a programmable conductor memory device). With the description provided below, it will be readily apparent to one of ordinary skill in the art that the methods described herein may be used in various devices. In other words, the methods of the disclosure may be used whenever it is desired to form a semiconductor device structure.

Referring to FIG. 1, a memory structure 100 may include a base structure 102, dielectric structures 104 on or over the base structure 102 and separated from one another by trenches 105, and first conductive lines 106 (e.g., access lines, such as word lines) on or over the base structure 102 and within the trenches 105. The base structure 102 may comprise at least one electrically insulative material (e.g., at least one dielectric material), such as at least one of an oxide material (e.g., silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof), a nitride material (e.g., silicon nitride), an oxynitride material (e.g., silicon oxynitride), amphorous carbon, or a combination thereof (e.g., a laminate of at least two of the foregoing). In some embodiments, the base structure 102 is formed of and includes silicon nitride ($Si_3N_4$). The base structure 102 may be positioned in, on, or over a substrate.

The dielectric structures 104 may be formed of and include at least one dielectric material, such as at least one of an oxide material (e.g., silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof), a nitride material (e.g., $Si_3N_4$), an oxynitride material (e.g., silicon oxynitride), amphorous carbon, or a combination thereof (e.g., a laminate of at least two of the foregoing). The material composition of the dielectric structures 104 may be the same as or may be different than the material composition of the base structure 102. In some embodiments, the dielectric structures 104 are formed of and include $Si_3N_4$. The dimensions (e.g., length, width, height) and spacing of each of the dielectric structures 104 may be selected to provide desired dimensions and spacing to one or more other features (e.g., word lines, storage element structures, electrode structures) of the memory structure 100, as described in further detail below. In some embodiments, the dielectric structures 104 are configured for a 4 $F^2$ memory architecture (i.e., where "F" represents minimum lithographic feature width). For example, a width of each of the dielectric structures 104 may be substantially the same as a distance (e.g., spacing) between adjacent dielectric structures 104. In additional embodiments, the dielectric structures 104 may be configured for a different memory architecture (e.g., a 6 $F^2$ memory architecture, an 8 $F^2$ memory architecture). Upper surfaces of the dielectric structures 104 may be substantially coplanar (e.g., may share a common plane) with one another.

The first conductive lines 106 may be formed of and include at least one conductive material, such as a metal, a metal alloy, a conductive metal oxide, a conductive metal nitride, a conductive metal silicide, a conductively doped semiconductor material, or combinations thereof. By way of non-limiting example, the first conductive lines 106 may be formed of and include at least one of tungsten (W), tungsten nitride (WN), nickel (Ni), tantalum (Ta), tantalum nitride (TaN), tantalum silicide (TaSi), platinum (Pt), copper (Cu), silver (Ag), gold (Au), aluminum (Al), molybdenum (Mo), titanium (Ti), titanium nitride (TiN), titanium silicide (TiSi), titanium silicon nitride (TiSiN), titanium aluminum nitride (TiAlN), molybdenum nitride (MoN), iridium (Ir), iridium oxide ($IrO_x$), ruthenium (Ru), ruthenium oxide ($RuO_x$), and conductively doped silicon. In some embodiments, the first conductive lines 106 are formed of and include W. A thickness of the first conductive lines 106 may be tailored to desired conductive line resistance properties of the memory structure 100. The first conductive lines 106 may fill a portion of the trenches 105 such that upper surfaces of the first conductive lines 106 may be recessed relative to the upper surfaces of the dielectric structures 104.

The base structure 102, the dielectric structures 104, and the first conductive lines 106 may be formed using conventional processes (e.g., conventional deposition processes, conventional photolithography processes, conventional material removal processes) and conventional processing equipment, which are not described in detail herein. By way of non-limiting example, a dielectric material may be formed (e.g., through at least one of in situ growth, spin-on coating, blanket coating, chemical vapor deposition (CVD), plasma enhanced chemical vapor deposition (PECVD), atomic layer deposition (ALD), and physical vapor deposition (PVD)) and patterned (e.g., masked, photoexposed, developed, and etched) over the base structure 102 to form the dielectric structures 104. A conductive material may then be formed (e.g., through at least one of in situ growth, spin-on coating, blanket coating, CVD, PECVD, ALD, and PVD) over and between the dielectric structures 104 and recessed (e.g., through at least one material removal process, such as at least one of a wet etching process and a dry etching process) to form the first conductive lines 106.

Figure 2:
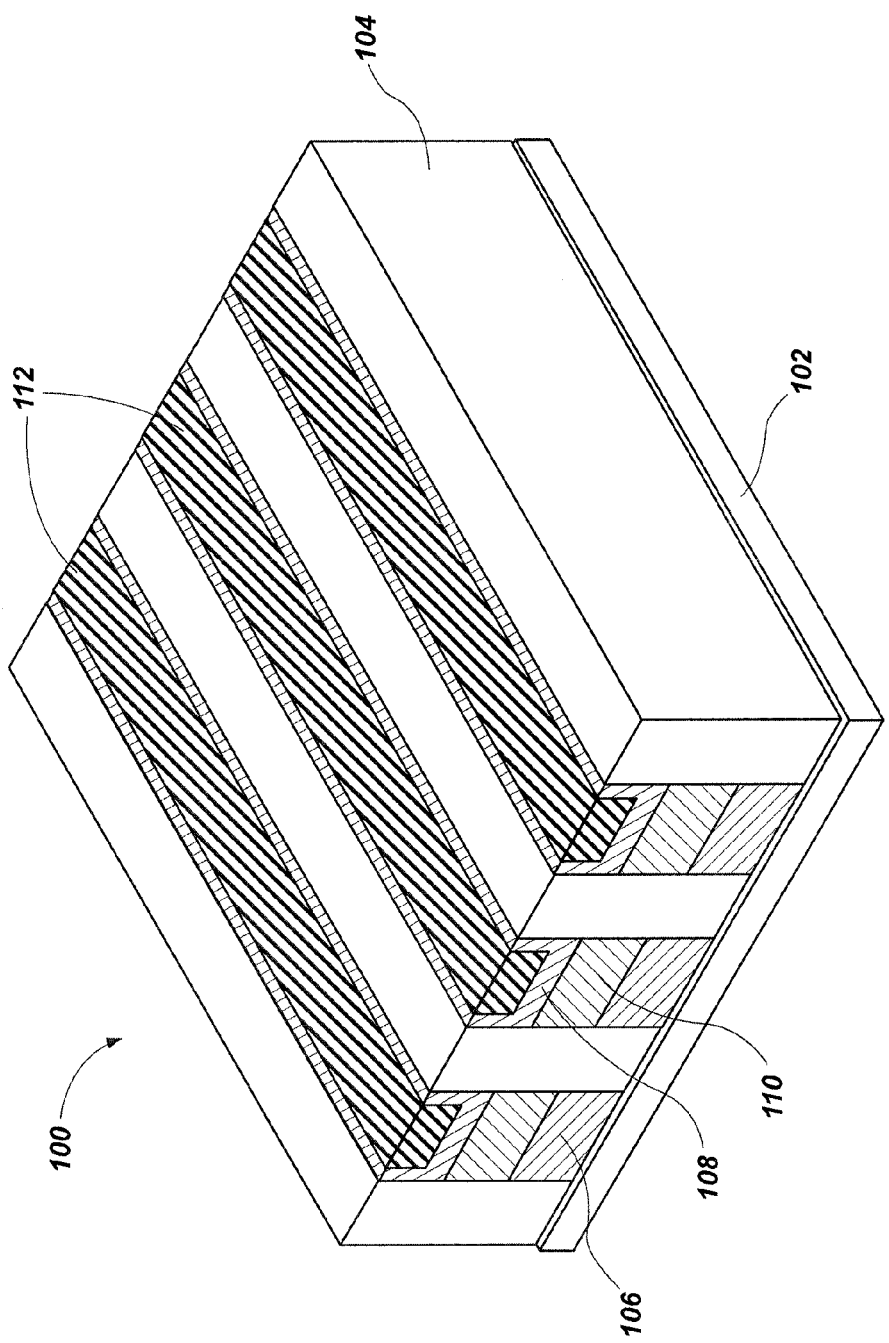

Referring next to FIG. 2, storage element structures 108 may be formed on or over the first conductive lines 106 within the trenches 105 (FIG. 1), and electrode structures 112 may be formed on or over the storage element structures 108 within the trenches 105. In addition, at least partially depending on the properties of the storage element structures 108, buffer structures 110 may, optionally, be formed between the first conductive lines 106 and the storage element structures 108 within the trenches 105.

The storage element structures 108, which may also be characterized as programmable structures, may be formed of and include at least one resistance variable material. As used herein, the term "resistance variable material" means and includes a material formulated to be switched from one resistance state to another resistance state upon application of at least one physical signal (e.g., at least one of heat, voltage, current, or other physical phenomena) thereto. Embodiments of the disclosure are not limited to a particular resistance variable material. The storage element structures 108 may, for example, be formed of and include a resistance variable material configured and formulated for one or more of RRAM, CBRAM, MRAM, PCM memory, PCRAM, STTRAM, oxygen vacancy-based memory, and programmable conductor memory. Suitable resistance variable materials include, but are not limited to, active switching materials (e.g., solid state electrolyte materials, such as transition metal oxide (TMO) materials, chalcogenide materials, dielectric metal oxide materials, mixed valence oxides including two or more metals and/or metalloids), metal ion source materials, oxygen-gettering materials, phase change materials, binary metal oxide materials, colossal magnetoresistive materials, and polymer-based resistance variable materials. In some embodiments, the storage element structures 108 are formed of and include an oxide material.

The storage element structures 108 may exhibit any desired shape and any desired size within the trenches 105 (FIG. 1). For example, the storage element structures 108 may laterally extend on or over upper surfaces of the first conductive lines 106, and may longitudinally extend on or over opposing sidewalls of the dielectric structures 104. As used herein, each of the terms "lateral" and "laterally" means and includes extending in a direction substantially parallel to the base structure 102, regardless of the orientation of the base structure 102. Accordingly, as used herein, each of the terms "longitudinal" and "longitudinally" means and includes extending in a direction substantially perpendicular to the base structure 102, regardless of the orientation of the base structure 102. As shown in FIG. 2, in some embodiments, the storage element structures 108 may exhibit a generally "U-shaped" geometry including elevated portions adjacent the opposing sidewalls of the dielectric structures 104 and recessed portions proximate central regions of the trenches 105. The storage element structures 108 may be substantially confined (e.g., substantially longitudinally confined, substantially laterally confined) within boundaries (e.g., longitudinal boundaries, lateral boundaries) of the trenches 105. The storage element structures 108 may exhibit any desired thickness within the trenches 105.

If present, the buffer structures 110 may comprise at least one material formulated to serve as one or more of an ion reservoir, a solid electrolyte ion conductor, and an ion diffusion barrier. The buffer structures 110 may be homogeneous (e.g., may comprise a single material layer), or may be heterogeneous (e.g., may comprise a stack of at least two different material layers). The presence or absence of the buffer structures 110 may at least partially depend on the properties of the storage element structures 108 (which may depend on the type of memory device the storage element structures 108 are to be included in). As a non-limiting example, the buffer structures 110 may be included if the storage element structures 108 are funned of and include an active switching material (e.g., a TMO material, a dielectric metal oxide, a chalcogenide material), a metal ion source material, or an oxygen-gettering material. As another non-limiting example, the buffer structures 110 may be omitted (e.g., absent) if the storage element structures 108 are formed of and include a phase change material. In some embodiments, the buffer structures 110 are present and comprise an ion reservoir material on or over the first conductive lines 106, and a solid electrolyte ion conductor material on or over the ion reservoir material. If included, the buffer structures 110 may exhibit any desired shape and any desired size within the trenches 105 (FIG. 1).

The electrode structures 112 (e.g., electrode contacts) may be formed of and include a conductive material, such as a metal, a metal alloy, a conductive metal oxide, a conductive metal nitride, a conductive metal silicide, a conductively doped semiconductor material, or combinations thereof. The electrode structures 112 may, for example, be formed of and include at least one of W, WN, Ni, Ta, TaN, TaSi, Pt, Cu, Ag, Au, Al, Mo, Ti, TiN, TiSi, TiSiN, TiAlN, MoN, Ir, IrO$_x$, Ru, RuO$_x$, and conductively doped silicon. The material composition of the electrode structures 112 may be the same as or may be different than the material composition of the first conductive lines 106. In some embodiments, the electrode structures 112 are formed of and include TiN. The electrode structures 112 may exhibit any desired shape and any desired size within the trenches 105 (FIG. 1). The electrode structures 112 may be at least partially surrounded by the storage element structures 108 within the trenches 105. For example, as shown in FIG. 2, lower surfaces and opposing sidewalls of the electrode structures 112 may be surrounded by the storage element structures 108 within the trenches 105. The electrode structures 112 may be substantially confined (e.g., substantially longitudinally confined, substantially laterally confined) within boundaries (e.g., longitudinal boundaries, lateral boundaries) of the trenches 105. The upper surfaces of the dielectric structures 104 may be substantially coplanar (e.g., may share a common plane) with upper surfaces of the electrode structures 112.

One or more of the storage element structures 108, the electrode structures 112, and the buffer structures 110 (if any) may be formed through a damascene process (e.g., a non-etch-based process, such as a process free of plasma etching). By way of non-limiting example, in some embodiments, a buffer material may be formed on or over the dielectric structures 104 and the first conductive lines 106, a storage element material may be formed on or over the buffer material, and a conductive material may be formed on or over the storage element material. At least one polishing process (e.g., at least one chemical-mechanical polishing (CMP) process) may then be employed to remove portions of the conductive material, the storage element material, and the buffer material outside of the trenches 105 (FIG. 1) (e.g., portions of the conductive material, the storage element material, and the buffer material overlying upper surfaces of the dielectric structures 104) to form the electrode structures 112, the storage element structures 108, and the buffer structures 110. In additional embodiments, the buffer structures 110 (if any) may be formed prior to forming the electrode structures 112 and the storage element structures 108. For example, a buffer material may be formed on or over the dielectric structures 104 and the first conductive lines 106, and may be recessed using at least one material removal process (e.g., at least one of a wet etching process and a dry etching process) to form the buffer structures 110 within the trenches 105. Thereafter, a storage element material may be formed on or over the buffer structures 110, the dielectric structures 104, and the first conductive lines 106, and a conductive material may be formed on or over the storage element material. At least one polishing process may then be used to remove portions of the conductive material and the storage element material outside of the trenches 105 to form the electrode structures 112 and the storage element structures 108. In further embodiments wherein the buffer structures 110 are omitted, the storage element material may be formed on or over the dielectric structures 104 and the first conductive lines 106, the conductive material may be formed on or over the storage element material, and at least one polishing process may be used to remove portions of the conductive material and the storage element material outside the trenches 105 to form the electrode structures 112 and the storage element structures 108.

Forming one or more of the storage element structures 108, the electrode structures 112, and the buffer structures 110 (if any) through a damascene process may facilitate the formation of memory structures (e.g., 3D cross-point memory arrays) utilizing materials that cannot be etched. For example, forming one or more of the storage element structures 108, the electrode structures 112, and the buffer structures 110 through a damascene process may facilitate the use of materials (e.g., halogen-containing materials) that may not be compatible with and/or may be undesirably damaged by conventional etching processes, such as conventional plasma etching processes.

Figure 3:
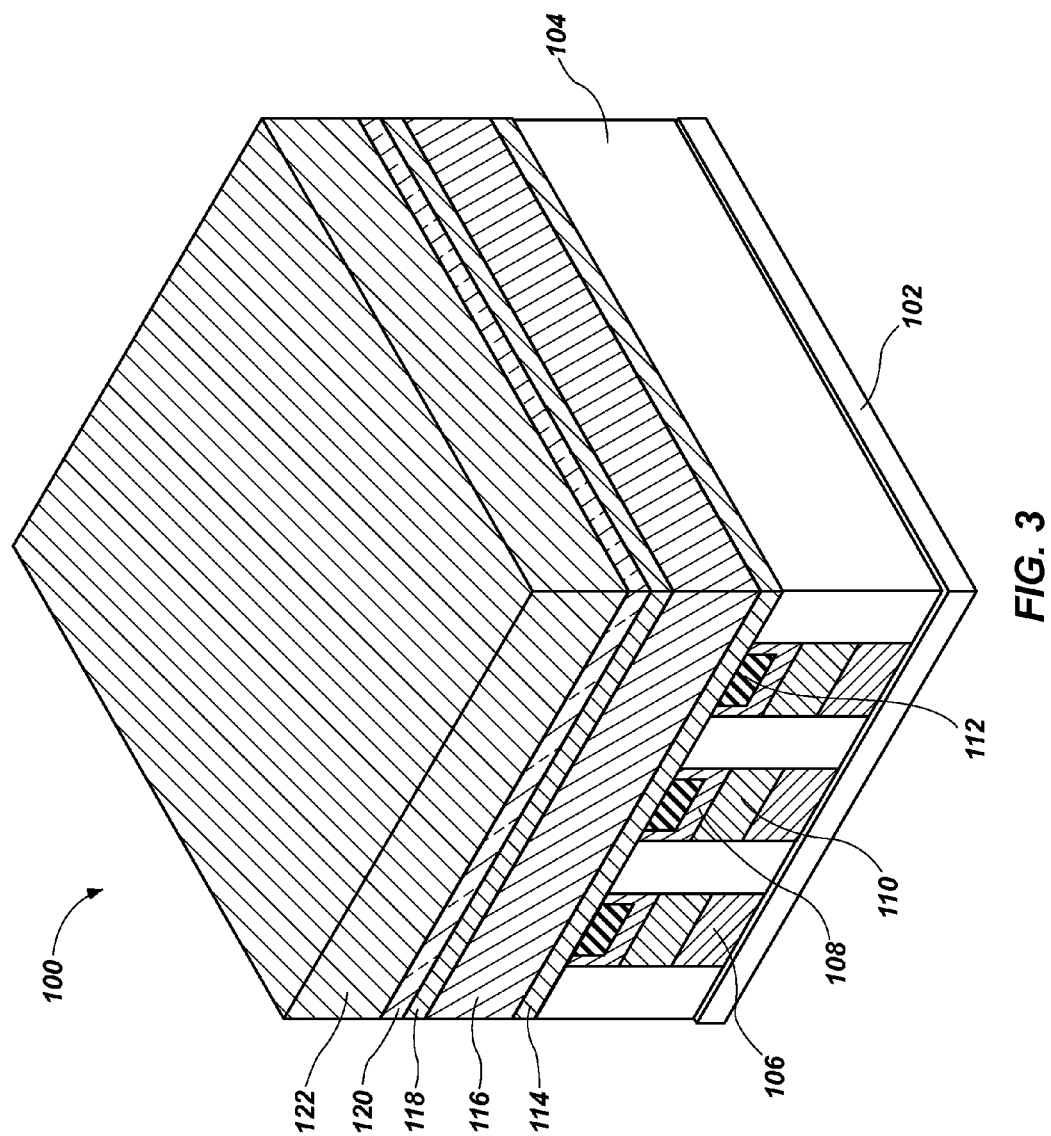

Referring next to FIG. 3, a select device material 114 may be formed on or over the dielectric structures 104, the storage element structures 108, and the electrode structures 112, a conductive line material 116 may be formed on or over the select device material 114, an additional select device material 118 may be formed on or over the conductive line material 116, an electrode material 120 may be formed on or over the additional select device material 118, and a masking material 122 may be formed on or over the electrode material 120.

The select device material 114 (e.g., access device material) may be formed of and include at least one material configured and formulated relative to the material composition(s) of the electrode structures 112 and the conductive line material 116 to form a switch for the storage element structures 108 thereunder. The select device material 114 may comprise one or more of at least one chalcogenide material, at least one semiconductor material, and at least one insulative material, which together with the electrode structures 112 and the conductive line material 116 forms a non-ohmic device (NOD) stack. The NOD stack may, for example, exhibit an ovonic threshold switch (OTS) configuration, a conductor-semiconductor-conductor (CSC) switch configuration, a metal-insulator-metal (MIM) switch configuration, a metal-semiconductor-metal (MSM) switch configuration, a metal-insulator-insulator-metal (MIIM) switch configuration, a metal-semiconductor-semiconductor-metal (MSSM) switch configuration, a metal-insulator-semiconductor-metal (MISM) switch configuration, a metal-semiconductor-insulator-metal (MSIM) switch configuration, a metal-insulator-semiconductor-insulator-metal (MISIM) switch configuration, a metal-semiconductor-insulator-semiconductor-metal (MSISM) switch configuration, a metal-insulator-insulator-insulator-metal (MIIIM) switch configuration, a metal-semiconductor-semiconductor-semiconductor-metal (MSSSM) switch configuration, or another type of two-terminal select device configuration. The select device material 114 may be formed on or over the dielectric structures 104, the storage element structures 108, and the electrode structures 112 to any desired thickness.

The conductive line material 116 may be formed of and include a conductive material such as a metal, a metal alloy, a conductive metal oxide, a conductive metal nitride, a conductive metal silicide, a conductively doped semiconductor material, or combinations thereof. The conductive line material 116 may, for example, be formed of and include at least one of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, and conductively doped silicon. The material composition of the conductive line material 116 may be the same as or may be different than the material composition(s) of one or more of the first conductive lines 106 and the electrode structures 112. In at least some embodiments, the conductive line material 116 is formed of and includes W. The conductive line material 116 may be formed on or over the select device material 114 to any desired thickness.

The additional select device material 118 (e.g., additional access device material) may be formed of and include at least one material configured and formulated relative to the material composition(s) of the conductive line material 116 and the electrode material 120 to form a switch for additional storage element structures to be subsequently formed thereover. The additional select device material 118 may comprise one or more of at least one chalcogenide material, at least one semiconductor material, and at least one insulative material, which together with the conductive line material 116 and the electrode material 120 forms an additional NOD stack. The additional NOD stack may, for example, exhibit an OTS configuration, a CSC switch configuration, a MIM switch configuration, a MSM switch configuration, a MIIM switch configuration, a MSSM switch configuration, a MISM switch configuration, a MSIM switch configuration, a MISIM switch configuration, a MSISM switch configuration, a MIIIM switch configuration, a MSSSM switch configuration, or another type of two-terminal select device configuration. The additional select device material 118 may be formed on or over the conductive line material 116 to any desired thickness. The additional select device material 118 may exhibit substantially the same material composition and thickness as the select device material 114, or at least one of the material composition and the thickness of the additional select device material 118 may be different than the material composition and/or the thickness of the select device material 114.

The electrode material 120 may be formed of and include a conductive material, such as a metal, a metal alloy, a conductive metal oxide, a conductive metal nitride, a conductive metal silicide, a conductively doped semiconductor material, or combinations thereof. The electrode material 120 may, for example, be formed of and include at least one of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, and conductively doped silicon. The material composition of the electrode material 120 may be the same as or may be different than the material composition(s) of one or more of the first conductive lines 106, the electrode structures 112, and the conductive line material 116. In at least some embodiments, the electrode material 120 is formed of and includes TiN. The electrode material 120 may be formed on or over the additional select device material 118 to any desired thickness. The electrode material 120 may exhibit substantially the same thickness as the electrode structures 112, or may exhibit a different thickness than the electrode structures 112.

The masking material 122 may be formed of and include at least one material (e.g., at least one hard mask material) suitable for use as an etch mask to pattern one or more of the materials and the structures thereunder (e.g., one or more of the electrode material 120, the additional select device material 118, the conductive line material 116, the select device material 114, and the electrode structures 112). By way of non-limiting example, the masking material 122 may be formed of and include at least one of amorphous carbon, silicon, a silicon oxide, a silicon nitride, a silicon oxycarbide, aluminum oxide, and a silicon oxynitride. The masking material 122 may be homogeneous (e.g., may comprise a single material layer), or may be heterogeneous (e.g., may comprise a stack exhibiting at least two different material layers). The masking material 122 may be formed on or over the electrode material 120 to any desired thickness.

The select device material 114, the conductive line material 116, the additional select device material 118, the electrode material 120, and the masking material 122 may be formed using conventional processes (e.g., conventional deposition processes, such as at least one of in situ growth, spin-on coating, blanket coating, CVD, PECVD, ALD, and PVD) and conventional processing equipment, which are not described in detail herein.

Figure 4A:
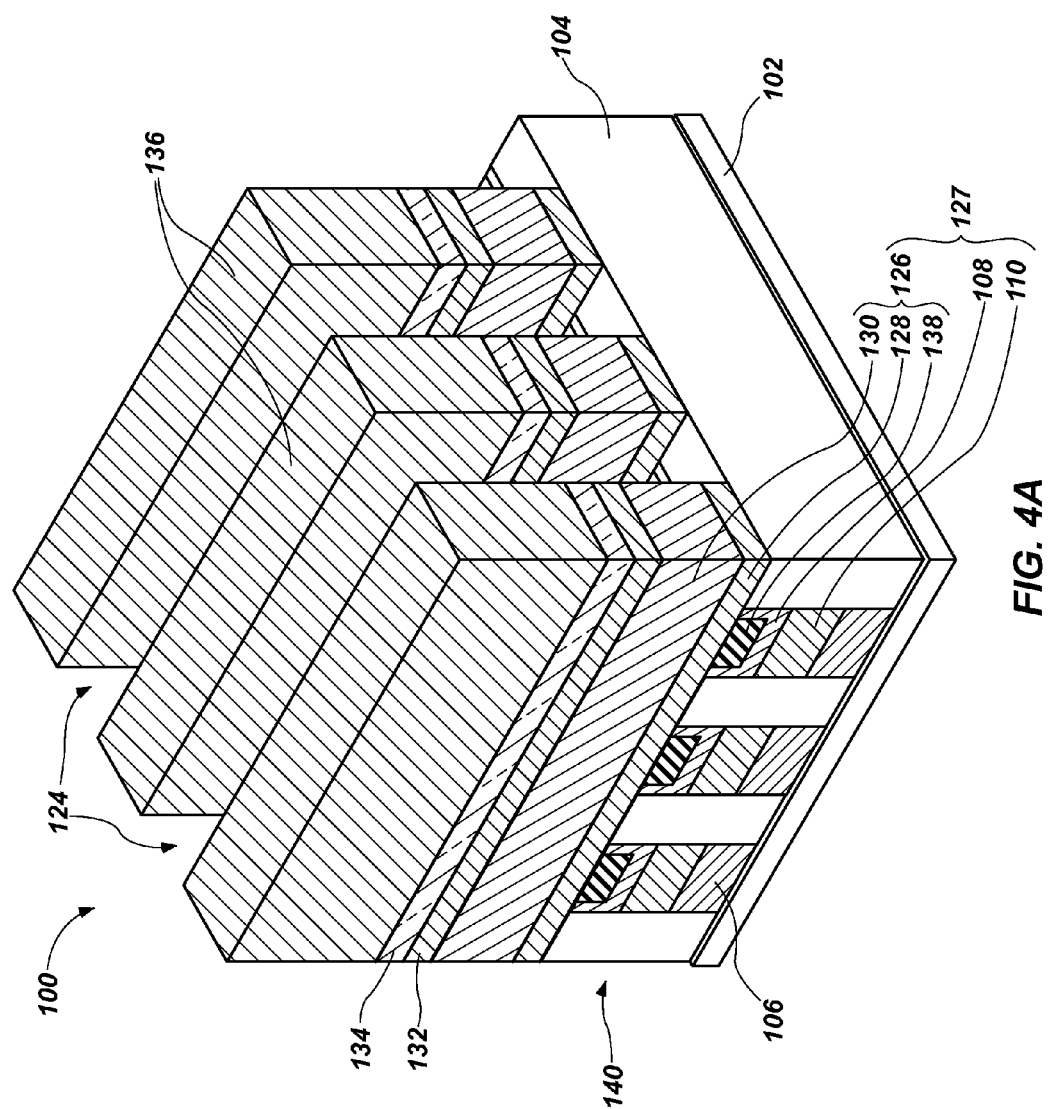
FIGS. 4A and 4B, are perspective views illustrating a method of forming a memory structure, in accordance with embodiments of the disclosure.
Figure 4B:
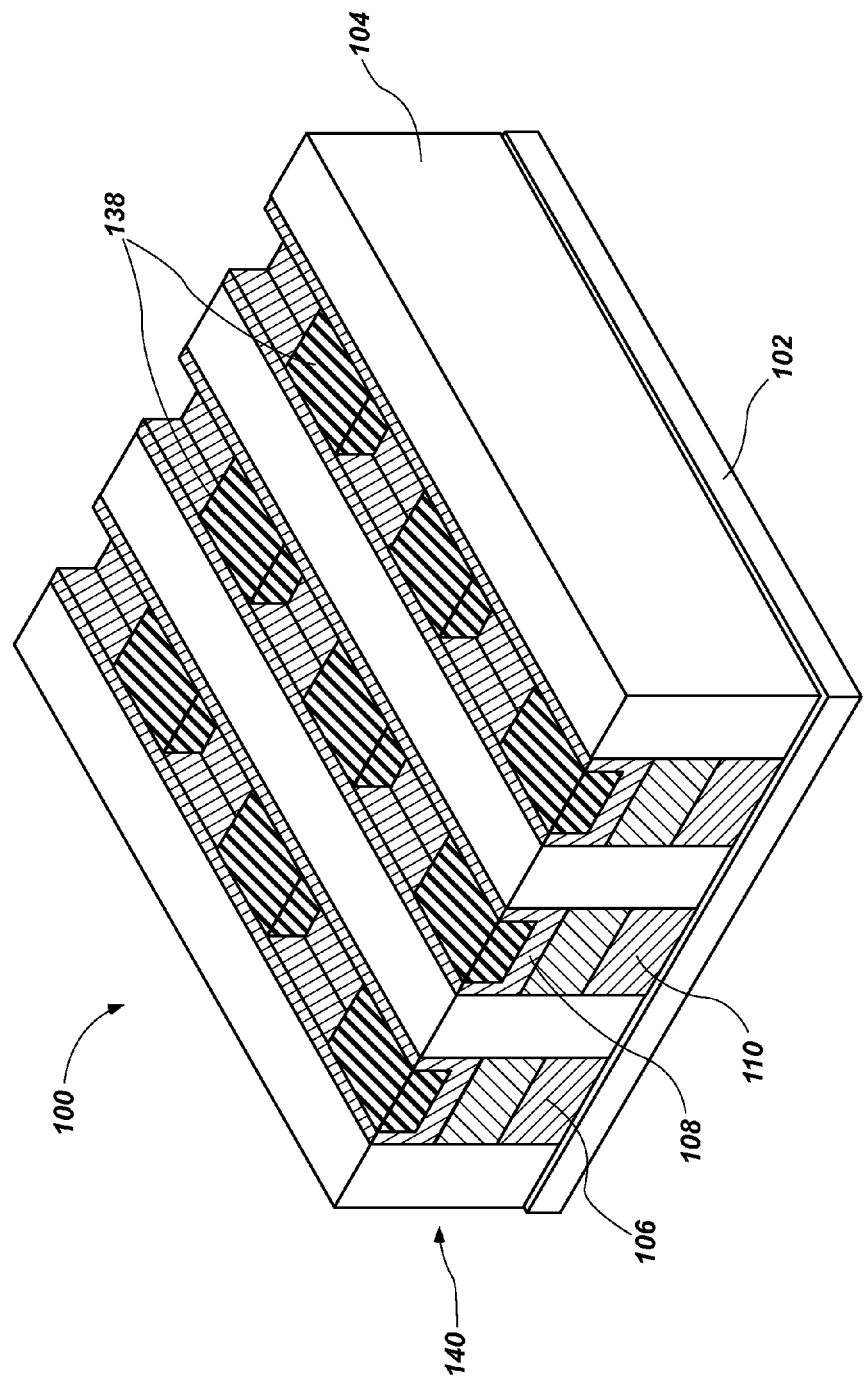

Referring next to FIG. 4A, openings 124 may be formed through each of the masking material 122 (FIG. 3), the electrode material 120 (FIG. 3), the additional select device material 118 (FIG. 3), the conductive line material 116 (FIG. 3), the select device material 114 (FIG. 3), and the electrode structures 112 (FIG. 3) to form masking structures 136, additional electrode structures 134, additional select device structures 132, second conductive lines 130 (e.g., data lines, such as bit lines), select device structures 128, and isolated electrode structures 138, respectively. FIG. 4B shows the memory structure 100 at the processing stage depicted in FIG. 4A, with the masking structures 136, the additional electrode structures 134, the additional select device structures 132, the second conductive lines 130, and the select device structures 128 omitted to illustrate that the openings 124 (FIG. 4A) extend to upper surfaces of the storage element structures 108 to form the isolated electrode structures 138.

Returning to FIG. 4A, the lateral dimensions of the openings 124 may be substantially the same as or may be different than the lateral dimensions of the dielectric structures 104. In some embodiments, the openings 124 (and, hence, the isolated electrode structures 138, the select device structures 128, the second conductive lines 130, the additional select device structures 132, and the additional electrode structures 134) are configured for a 4 $F^2$ memory architecture. In addition, each of the additional electrode structures 134, the additional select device structures 132, the second conductive lines 130, and the select device structures 128 may extend in a direction substantially perpendicular (e.g., orthogonal) to a direction in which the dielectric structures 104, the first conductive lines 106, the storage element structures 108, and the buffer structures 110 (if any) extend.

As shown in FIG. 4A, the second conductive lines 130, the select device structures 128, and the isolated electrode structures 138 may form select device constructions 126 for a first deck 140 (e.g., a first tier, a first level) of the memory structure 100. In turn, the select device constructions 126, the storage element structures 108, and the buffer structures 110 (if any) may form memory cells 127 for the first deck 140 of the memory structure 100. Furthermore, the second conductive lines 130, the additional select device structures 132, and the additional electrode structures 134 may be utilized to form additional select device constructions for a second deck (e.g., a second tier, a second level) of the memory structure 100, as described in further detail below. In turn, such additional select device constructions, in combination with subsequently formed additional storage element structures and subsequently formed buffer structures (if any), may form additional memory cells for the second deck of the memory structure 100, as also described in further detail below. The second conductive lines 130 may be shared by (e.g., may be common to) the first deck 140 and the second deck of the memory structure 100.

At least one material removal process may be used to form the openings 124 (and, hence, the masking structures 136, the additional electrode structures 134, the additional select device structures 132, the second conductive lines 130, the select device structures 128, and the isolated electrode structures 138). For example, the masking material 122 (FIG. 3), the electrode material 120 (FIG. 3), the additional select device material 118 (FIG. 3), the conductive line material 116 (FIG. 3), the select device material 114 (FIG. 3), and the electrode structures 112 (FIG. 3) may be exposed to at least one etching process (e.g., at least one dry etching process, such as at least one of a reactive ion etching (RIE) process, a deep RIE process, a plasma etching process, a reactive ion beam etching process, and a chemically assisted ion beam etching process; at least one wet etching process, such as at least one of a hydrofluoric acid etching process, a buffered hydrofluoric acid etching process, and a buffered oxide etching process) to form the openings 124 extending to the storage element structures 108 (e.g., extending to upper surfaces of the storage element structures 108). The material removal process may remove exposed portions of the masking material 122, the electrode material 120, the additional select device material 118, the conductive line material 116, the select device material 114, and the electrode structures 112 without substantially removing exposed portions of the storage element structures 108.

The methods of the disclosure advantageously facilitate the formation of the additional electrode structures 134, the additional select device structures 132, the second conductive lines 130, the select device structures 128, and the isolated electrode structures 138 without having to perform multiple photolithographic patterning processes. For example, a single photolithographic patterning process (e.g., a single photoresist deposition, masking, and patterning process) may be utilized to form a pattern for the openings 124, and the pattern may be extended to the storage element structures 108 to form the additional electrode structures 134, the additional select device structures 132, the second conductive lines 130, the select device structures 128, and the isolated electrode structures 138. Using the single photolithographic patterning process to form the additional electrode structures 134, the additional select device structures 132, the second conductive lines 130, the select device structures 128, and the isolated electrode structures 138 may enhance efficiency and reduce processing complexity as compared to conventional methods of forming memory structures.

Figure 5:
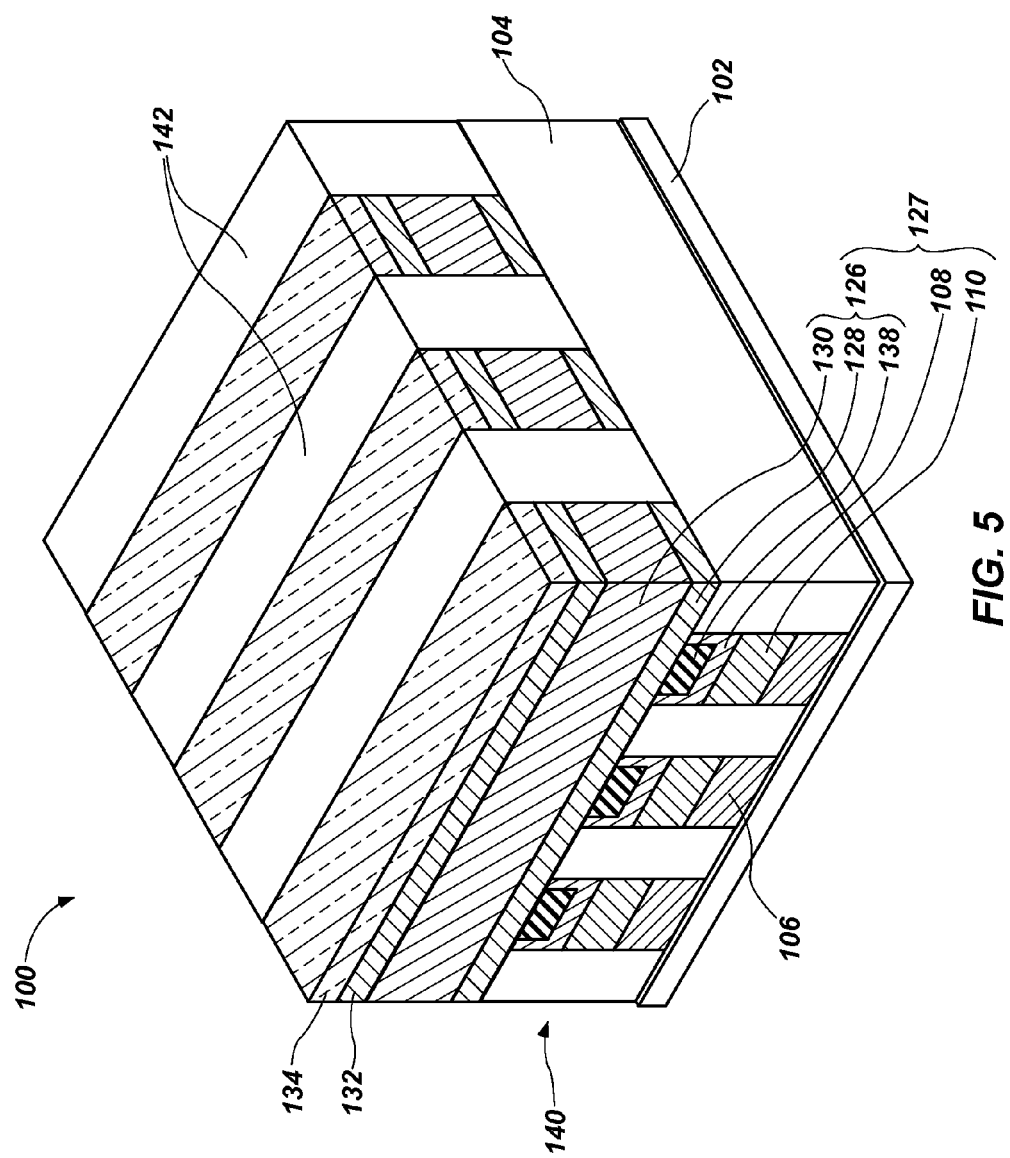

Referring next to FIG. 5, additional dielectric structures 142 may be formed within the openings 124 (FIG. 4A). The additional dielectric structures 142 may be formed of and include at least one dielectric material, such as at least one of an oxide material (e.g., silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, a combination thereof), a nitride material (e.g., $Si_3N_4$), an oxynitride material (e.g., silicon oxynitride), amphorous carbon, or a combination thereof (e.g., a laminate of at least two of the foregoing). The material composition of the additional dielectric structures 142 may be substantially the same as or may be different than the material composition(s) of one or more of the base structure 102 and the dielectric structures 104. In some embodiments, the additional dielectric structures 142 are formed of and include $Si_3N_4$.

As shown in FIG. 5, the additional dielectric structures 142 may substantially fill portions of the openings 124 (FIG. 4A) at least partially defined by the additional electrode structures 134, the additional select device structures 132, the second conductive lines 130, the select device structures 128, and the isolated electrode structures 138. For example, the additional dielectric structures 142 may be formed on or over upper surfaces of the storage element structures 108 and the dielectric structures 104 exposed by the openings 124, and may be formed laterally between the additional electrode structures 134, the additional select device structures 132, the second conductive lines 130, the select device structures 128, and the isolated electrode structures 138. The lateral dimensions of the additional dielectric structures 142 may correspond to the lateral dimensions of the openings 124. In addition, upper surfaces of the additional dielectric structures 142 may be substantially coplanar (e.g., may share a common plane) with one another and with upper surfaces of the additional electrode structures 134.

The additional dielectric structures 142 may be formed using conventional processes (e.g., conventional deposition processes, conventional material removal processes) and conventional processing equipment, which are not described in detail herein. By way of non-limiting example, a dielectric material may be formed (e.g., through at least one of in situ growth, spin-on coating, blanket coating, CVD, PECVD, ALD, and PVD) inside and outside of the openings 124 (FIG. 4A) to substantially fill the openings 124, and then at least one material removal process (e.g., at least one CMP process) may be used to substantially remove portions of the dielectric material outside of the openings 124 (e.g., portions of the dielectric material overlying upper surfaces of the additional electrode structures 134) and form the additional dielectric structures 142. In some embodiments, the masking structures 136 (FIG. 4A) are removed prior to forming the additional dielectric structures 142 (e.g., prior to forming the dielectric material within the openings 124). In additional embodiments, the dielectric material may be formed inside and outside of the openings 124, and then the masking structures 136 and portions of the dielectric material outside of the openings 124 may be substantially removed to form the additional dielectric structures 142.

Figure 6:
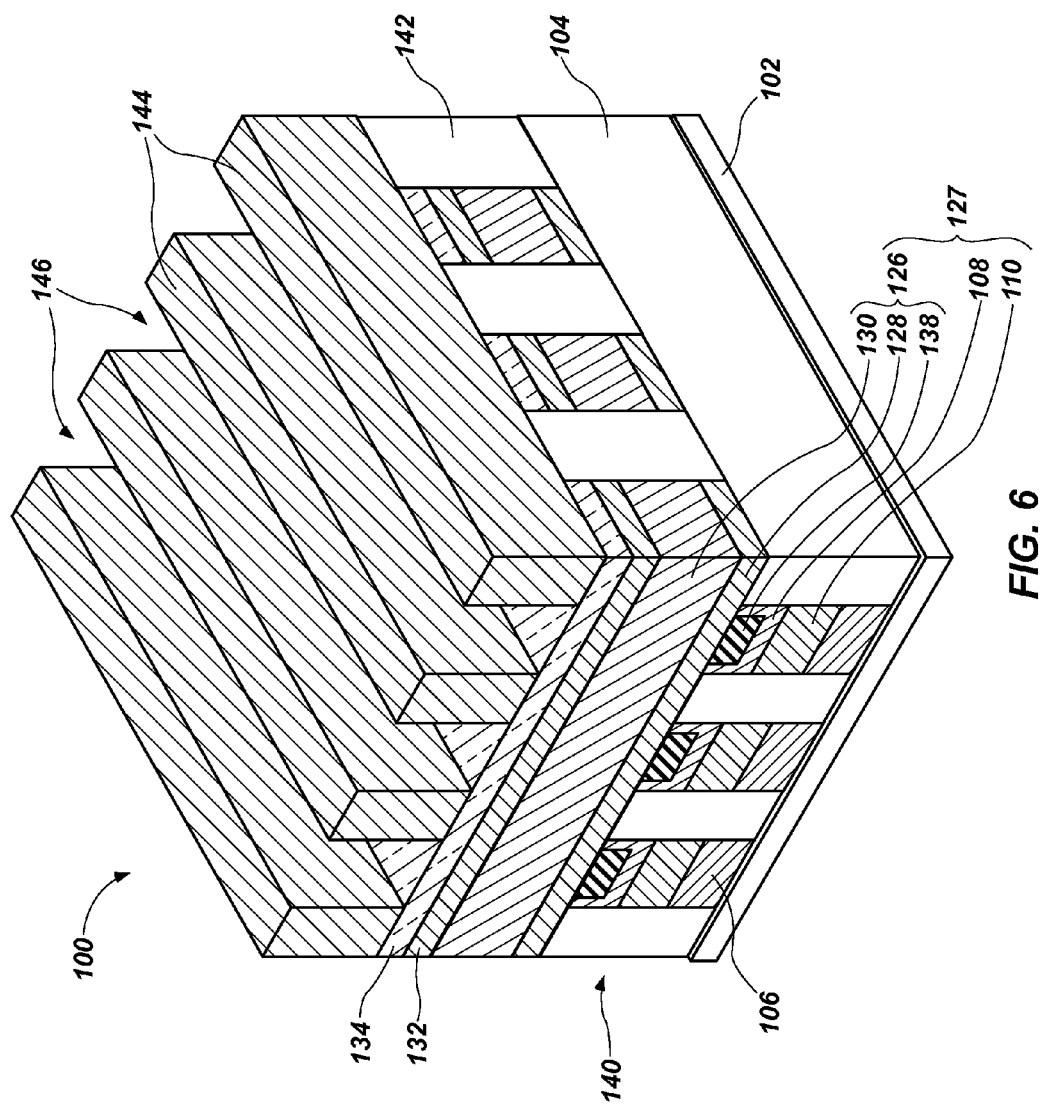

Referring next to FIG. 6, sacrificial structures 144 separated from one another by additional trenches 146 may be formed on or over the upper surfaces of the additional electrode structures 134 and the additional dielectric structures 142. The sacrificial structures 144 may be formed of and include at least one material selectively etchable relative to the additional electrode structures 134, the additional dielectric structures 142, and additional structures (e.g., additional buffer structures, additional storage element structures, additional word lines) to be formed within the additional trenches 146. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. By way of non-limiting example, the sacrificial structures 144 may be formed of and include amorphous carbon.

The dimensions and spacing of the sacrificial structures 144 and of the additional trenches 146 may be selected at least partially based on desired dimensions and desired spacing of the additional structures (e.g., additional buffer structures, additional storage element structures, third conductive lines) to be formed within the additional trenches 146. In some embodiments, the dimensions and spacing of the sacrificial structures 144 and the additional trenches 146 are configured for a 4 $F^2$ memory architecture. In additional embodiments the dimensions and spacing of the sacrificial structures 144 and the additional trenches 146 are configured for a different memory architecture (e.g., a 6 $F^2$ memory architecture, an 8 $F^2$ memory architecture). Lateral dimensions of the additional trenches 146 may be substantially the same as the lateral dimensions of the dielectric structures 104, or may be different than the lateral dimensions of the dielectric structures 104. In addition, as shown in FIG. 6, the sacrificial structures 144 and the additional trenches 146 may extend in a direction substantially perpendicular to a direction in which the additional dielectric structures 142, the additional electrode structures 134, the additional select device structures 132, the second conductive lines 130, and the select device structures 128 extend. Namely, the sacrificial structures 144 and the additional trenches 146 may extend in substantially the same direction as the dielectric structures 104, the first conductive lines 106, the storage element structures 108, and the buffer structures 110 (if any).

The sacrificial structures 144 may be formed using conventional processes (e.g., conventional deposition processes, conventional material removal processes) and conventional processing equipment, which are not described in detail herein. By way of non-limiting example, a sacrificial material may be formed (e.g., through at least one of in situ growth, spin-on coating, blanket coating, CVD, PECVD, ALD, and PVD) on or over the additional electrode structures 134 and the additional dielectric structures 142. Thereafter, at least one material removal process (e.g., at least one etching process, such as at least one dry etching process) may be used to remove portions of the sacrificial material to upper surfaces of the additional electrode structures 134 and the additional dielectric structures 142 and form the sacrificial structures 144 and the additional trenches 146.

Figure 7:
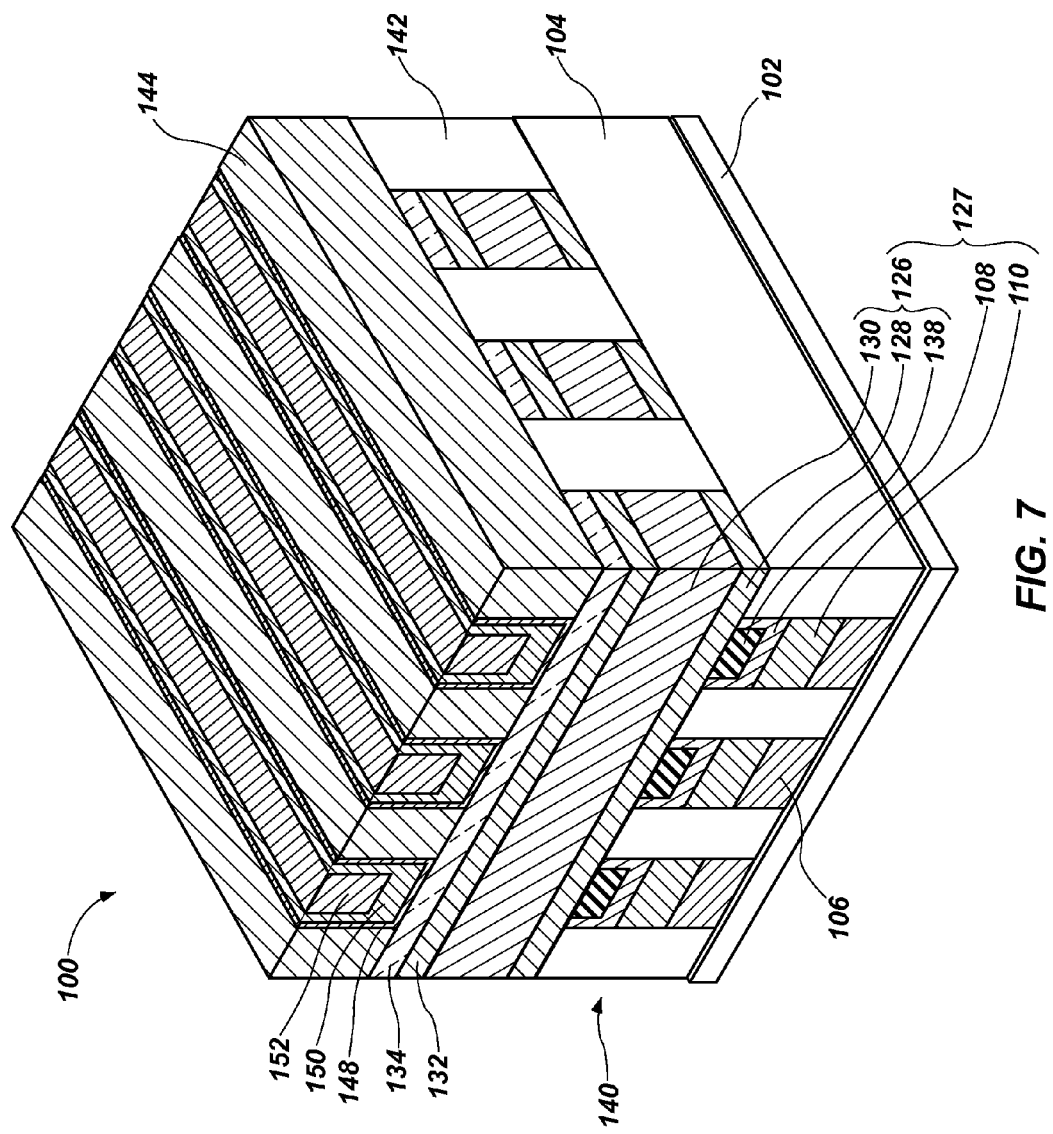

Referring next to FIG. 7, additional storage element structures 148 may be formed within the additional trenches 146 (FIG. 6), and third conductive lines 152 (e.g., additional access lines, such as additional word lines) may be formed on or over the additional storage element structures 148 within the additional trenches 146. In addition, at least partially depending on the properties of the additional storage element structures 148, additional buffer structures 150 may, optionally, be formed between the additional storage element structures 148 and the third conductive lines 152 within the additional trenches 146.

The additional storage element structures 148, which may also be characterized as additional programmable structures, may be formed of and include at least one resistance variable material. Embodiments of the disclosure are not limited to a particular resistance variable material. The additional storage element structures 148 may, for example, be formed of and include a resistance variable material configured and formulated for one or more RRAM, CBRAM, MRAM, PCM memory, PCRAM, STTRAM, oxygen vacancy-based memory, and programmable conductor memory. Suitable resistance variable materials include, but are not limited to, active switching materials (e.g., solid state electrolyte materials, such as transition metal oxide materials, chalcogenide materials, dielectric metal oxide materials, mixed valence oxides including two or more metals and/or metalloids), metal ion source materials, oxygen-gettering materials, phase change materials, binary metal oxide materials, colossal magnetoresistive materials, and polymer-based resistance variable materials. In some embodiments, the additional storage element structures 148 are formed of and include an oxide material. The material composition of the additional storage element structures 148 may be substantially the same as or may be different than the material composition of the storage element structures 108. In some embodiments, the material composition of the additional storage element structures 148 is substantially the same as the material composition of the storage element structures 108.

The additional storage element structures 148 may exhibit any desired shape and any desired size within the additional trenches 146 (FIG. 6). For example, the additional storage element structures 148 may laterally extend on or over upper surfaces of additional electrode structures 134 and the additional dielectric structures 142, and may longitudinally extend on or over opposing sidewalls of the sacrificial structures 144. As shown in FIG. 7, the additional storage element structures 148 may exhibit a generally "U-shaped" geometry including elevated portions adjacent the opposing sidewalls of the sacrificial structures 144 and recessed portions proximate central regions of the additional trenches 146. In additional embodiments, the additional storage element structures 148 may exhibit a different shape within the additional trenches 146, such as a substantially rectangular shape. The additional storage element structures 148 may be substantially confined (e.g., substantially longitudinally confined, substantially laterally confined) within boundaries (e.g., longitudinal boundaries, lateral boundaries) of the additional trenches 146. The additional storage element structures 148 may exhibit any desired thickness within the additional trenches 146. The additional storage element structures 148 may exhibit substantially the same shape and substantially the same size as the storage element structures 108, or the additional storage element structures 148 may exhibit at least one of a different shape and a different size than the storage element structures 108.

If present, the additional buffer structures 150 may comprise at least one material formulated to serve as one or more of an ion reservoir, a solid electrolyte ion conductor, and an ion diffusion barrier. The additional buffer structures 150 may be homogeneous (e.g., may comprise a single material layer), or may be heterogeneous (e.g., may comprise a stack of at least two different material layers). The presence or absence of the additional buffer structures 150 may at least partially depend on the properties of the additional storage element structures 148 (which may depend on the type of memory the additional storage element structures 148 are to be included in). As a non-limiting example, the additional buffer structures 150 may be included if the additional storage element structures 148 are formed of and include an active switching material (e.g., a transition metal oxide material, a dielectric metal oxide, a chalcogenide material), a metal ion source material, or an oxygen-gettering material. As another non-limiting example, the additional buffer structures 150 may be omitted (e.g., absent) if the additional storage element structures 148 are formed of and include a phase change material. The material composition of the additional buffer structures 150 may be substantially the same as or may be different than the material composition of the buffer structures 110. In some embodiments, the additional buffer structures 150 are present and comprise a solid electrolyte ion conductor material on or over the additional electrode structures 134 and the additional dielectric structures 142, and an ion reservoir material on or over the solid electrolyte ion conductor material.

If included, the additional buffer structures 150 may exhibit any desired shape and any desired size within the additional trenches 146 (FIG. 6). The additional buffer structures 150 may be at least partially surrounded by the additional storage element structures 148 within the additional trenches 146. For example, lower surfaces and opposing sidewalls of the additional buffer structures 150 may be surrounded by the additional storage element structures 148 within the additional trenches 146. As shown in FIG. 7, in some embodiments, the additional buffer structures 150 exhibit a generally "U-shaped" geometry including elevated portions adjacent the opposing sidewalls of the additional storage element structures 148 and recessed portions proximate central regions of the additional trenches 146. In additional embodiments, the additional buffer structures 150 may exhibit a different shape within the additional trenches 146, such as a substantially rectangular shape. The additional buffer structures 150 (if any) may be substantially confined (e.g., substantially longitudinally confined, substantially laterally confined) within boundaries (e.g., longitudinal boundaries, lateral boundaries) of the additional trenches 146. The additional buffer structures 150 may exhibit any desired thickness within the additional trenches 146.

The third conductive lines 152 may be formed of and include at least one conductive material, such as a metal, a metal alloy, a conductive metal oxide, a conductive metal nitride, a conductive metal silicide, a conductively doped semiconductor material, or combinations thereof. By way of non-limiting example, the third conductive lines 152 may be formed of and include at least one of W, WN, Ni, Ta, TaN, TaSi, Pt, Cu, Ag, Au, Al, Mo, Ti, TiN, TiSi, TiSiN, TiAlN, MoN, Ir, IrO$_x$, Ru, RuO$_x$, and conductively doped silicon. The material composition of the third conductive lines 152 may be the same as or may be different than the material composition(s) of one or more of the first conductive lines 106, the isolated electrode structures 138, the second conductive lines 130, and the additional electrode structures 134. In some embodiments, the third conductive lines 152 are formed of and include W. The third conductive lines 152 may exhibit any desired shape and any desired size within the additional trenches 146 (FIG. 6). The third conductive lines 152 may be at least partially surrounded by the additional storage element structures 148 and the additional buffer structures 150 (if present) within the additional trenches 146. For example, as shown in FIG. 7, lower surfaces and opposing sidewalls of the third conductive lines 152 may be surrounded by the additional storage element structures 148 and the additional buffer structures 150 within the additional trenches 146. The third conductive lines 152 may be substantially confined (e.g., substantially longitudinally confined, substantially laterally confined) within boundaries (e.g., longitudinal boundaries, lateral boundaries) of the additional trenches 146. In some embodiments, upper surfaces of the third conductive lines 152 are substantially coplanar with the upper surfaces of the sacrificial structures 144.

One or more of the additional storage element structures 148, the additional buffer structures 150 (if any), and the third conductive lines 152 may be formed through a damascene process (e.g., a non-etch-based process, such as a process free of plasma etching). By way of non-limiting example, in some embodiments, an additional storage element material may be formed on or over the additional electrode structures 134, the additional dielectric structures 142, and the sacrificial structures 144, an additional buffer material may be formed on or over the additional storage element material, and an additional conductive material may be formed on or over the additional buffer material. At least one polishing process (e.g., at least one CMP process) may then be used to remove portions of the additional conductive material, the additional buffer material, and the additional storage element material outside of the additional trenches 146 (FIG. 6) (e.g., portions of the additional conductive material, the additional buffer material, and the additional storage element material overlying upper surfaces of the sacrificial structures 144) to form the third conductive lines 152, the additional buffer structures 150, and the additional storage element structures 148. In additional embodiments wherein the additional buffer structures 150 are omitted, the additional storage element material may be formed on or over the additional electrode structures 134, the additional dielectric structures 142, and the sacrificial structures 144, the additional conductive material may be formed on or over the additional storage element material, and at least one polishing process may be used to remove portions of the additional conductive material and the additional storage element material outside the additional trenches 146 to form the third conductive lines 152 and the additional storage element structures 148.

Forming one or more of the additional storage element structures 148, the additional buffer structures 150 (if any), and the third conductive lines 152 through a damascene process may at least provide advantages (e.g., increased flexibility in material selection) similar to those previously described in relation to forming one or more of the storage element structures 108, the electrode structures 112, and the buffer structures 110 (if any) through a damascene process.

Figure 8:
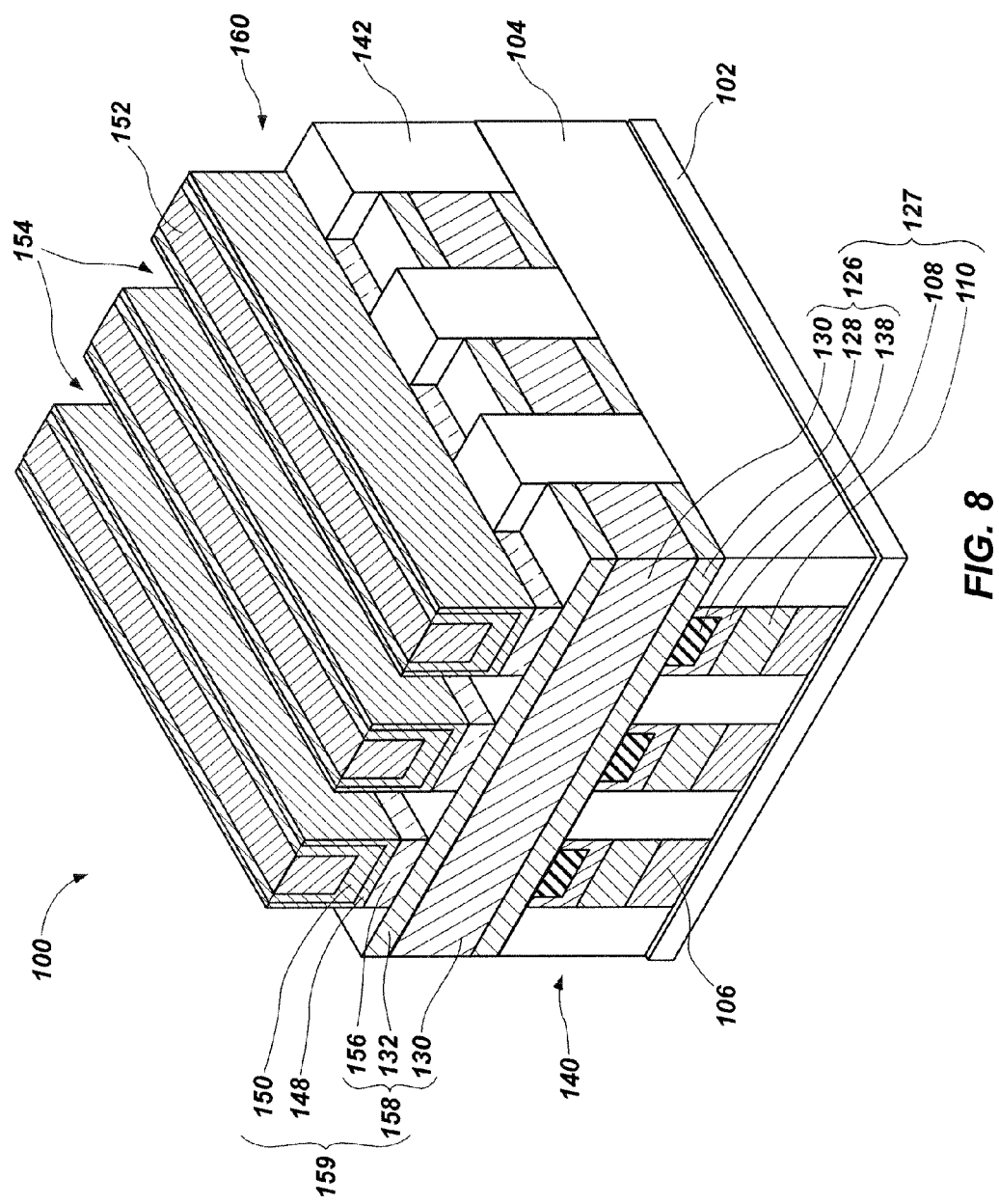

Referring next to FIG. 8, the sacrificial structures 144 (FIG. 7) and portions of the additional electrode structures 134 (FIG. 7) underlying the sacrificial structures 144 may be removed to form additional openings 154 and additional isolated electrode structures 156. At least one selective material removal process may be used to form the additional openings 154 and additional isolated electrode structures 156. The materials utilized in the selective material removal process may remove the sacrificial structures 144 and portions of the additional electrode structures 134 without substantially removing exposed portions of the third conductive lines 152, the additional buffer structures 150 (if present), the additional storage element structures 148, the additional dielectric structures 142, and the additional select device structures 132. By way of non-limiting example, if the sacrificial structures 144 comprise amorphous carbon and the additional electrode structures 134 comprise a metal material (e.g., a metal, a metal alloy, a metal oxide, a metal nitride, a metal silicide), an oxidizing plasma etching process may be performed to selectively remove the sacrificial structures 144, and then a metal etching process may be performed to selectively remove exposed portions of the additional electrode structures 134. A protective material (e.g., a nitride material, such as $Si_3N_4$) may, optionally, be formed on or over the third conductive lines 152, the additional buffer structures 150 (if present), and the additional storage element structures 148 prior to removing portions of the additional electrode structures 134 to form the additional isolated electrode structures 156.

The methods of the disclosure advantageously facilitate the formation of the additional isolated electrode structures 156 without having to perform a separate photolithographic patterning process (e.g., a photoresist deposition, masking, and patterning process). The third conductive lines 152, the additional buffer structures 150 (if present), the additional storage element structures 148 may be utilized as an etch mask for the formation of the additional isolated electrode structures 156. Using the third conductive lines 152, the additional buffer structures 150 (if present), and the additional storage element structures 148 as an etch mask to form the additional isolated electrode structures 156 may enhance efficiency and reduce processing complexity as compared to conventional methods of forming memory structures.

As shown in FIG. 8, the second conductive lines 130, the additional select device structures 132, and the additional isolated electrode structures 156 may form additional select device constructions 158 for a second deck 160 (e.g., a second tier, a second level) of the memory structure 100. In turn, the additional select device constructions 158, the additional storage element structures 148, and the additional buffer structures 150 (if any) may form additional memory cells 159 for the second deck 160 of the memory structure 100. The second conductive lines 130 may be shared by (e.g., may be common to) the first deck 140 and the second deck 160 of the memory structure 100.

Thus, in accordance with embodiments of the disclosure, a method of forming a memory structure comprises forming first conductive lines extending in a first direction within trenches located between dielectric structures over a base structure. Storage element structures are formed over the first conductive lines within the trenches. Electrode structures are formed over the storage element structures within the trenches. A material stack is formed over the dielectric structures and the electrode structures, the material stack comprising a select device material, a conductive line material over the select device material, an additional select device material over the conductive line material, an electrode material over the additional select device material, and a masking material over the electrode material. Openings are formed through the material stack and the electrode structures to form isolated electrode structures, select device structures over portions of the dielectric structures and the isolated electrode structures, second conductive lines over the select device structures, additional select device structures over the second conductive lines, and additional electrode structures over the additional select device structures, the openings extending in a second direction perpendicular to the first direction. Additional dielectric structures are formed over other portions of the dielectric structures and the storage element structures within the openings. Sacrificial structures are formed over portions of the additional electrode structures and the additional dielectric structures, the sacrificial structures separated from one another by additional trenches extending in the first direction. Additional storage element structures are formed over other portions of the additional electrode structures and the additional dielectric structures within the additional trenches. Third conductive lines are formed over the additional storage element structures within the additional trenches. The sacrificial structures and the portions of the additional electrode structures under the sacrificial structures are removed to form additional isolated electrode structures.

In addition, in accordance with embodiments of the disclosure, a memory structure comprises first conductive lines extending in a first direction over portions of a base structure, storage element structures extending in the first direction over the first conductive lines, isolated electrode structures overlying portions of the storage element structures, select device structures extending in a second direction perpendicular to the first direction over the isolated electrode structures, second conductive lines extending in the second direction over the select device structures, additional select device structures extending in the second direction over the second conductive lines, additional isolated electrode structures overlying portions of the additional select device structures, additional storage element structures extending in the first direction over the additional isolated electrode structures, and third conductive lines extending in the first direction over the additional storage element structures.

Furthermore, in accordance with embodiments of the disclosure, a cross-point memory array comprises a first deck, common bit lines, and a second deck. The first deck comprises word lines extending in a first direction over a base structure, storage element structures extending in the first direction over the word lines, isolated electrode structures over the storage element structures, and select device structures extending in a second direction perpendicular to the first direction over the isolated electrode structures. The common bit lines extend in the second direction over the select device structures. The second deck comprises other select device structures extending in the second direction over the common bit lines, other isolated electrode structures over the other select device structures, other storage element structures extending in the first direction over the other isolated electrode structures, and other word lines extending in the first direction over the other storage element structures.

Following the formation of the additional isolated electrode structures 156, the memory structure 100 may be subjected to additional processing (e.g., additional deposition processes, additional material removal processes), as desired. The additional processing may be conducted by conventional processes and conventional processing equipment, and is not illustrated or described in detail herein. By way of non-limiting example, at least one additional dielectric material may be formed on or over surfaces inside and outside of the additional openings 154 (e.g., surfaces of the third conductive lines 152, the additional buffer structures 150 (if present), the additional storage element structures 148, the additional isolated electrode structures 156, the additional dielectric structures 142, and the additional select device structures 132). Portions of the dielectric material may then be removed to form further dielectric structures positioned laterally between the additional memory cells 159 of the second deck 160 of the memory structure 100. The material composition of the further dielectric structures may be substantially the same as or may be different than the material composition(s) of one or more of the base structure 102, the dielectric structures 104, and the additional dielectric structures 142. In some embodiments, the further dielectric structures are formed of and include $Si_3N_4$.

Figure 9:
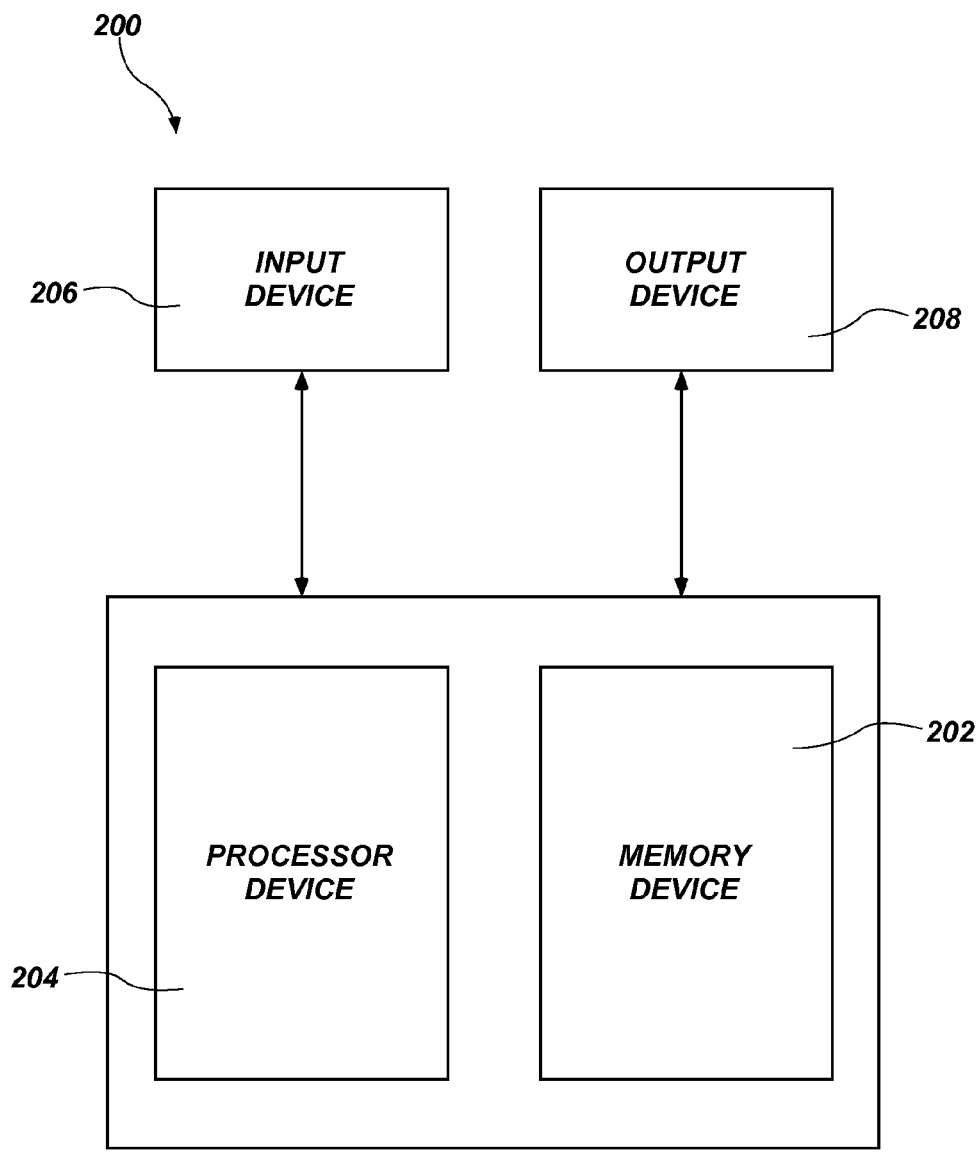
FIG. 9 is a schematic block diagram illustrating an electronic system in accordance with embodiments of the disclosure.

Memory devices (e.g., resistance variable memory devices, such as RRAM devices, CBRAM devices, MRAM devices, PCM memory devices, PCRAM devices, STTRAM devices, oxygen vacancy-based memory devices, and programmable conductor memory devices) that include the memory structure 100 in accordance with embodiments of the disclosure may be used in embodiments of electronic systems of the disclosure. For example, FIG. 9 is a block diagram of an illustrative electronic system 200 according to embodiments of disclosure. The electronic system 200 may comprise, for example, a computer or computer hardware component, a server or other networking hardware component, a cellular telephone, a digital camera, a personal digital assistant (PDA), portable media (e.g., music) player, a WiFi or cellular-enabled tablet such as, for example, an iPAD® or SURFACE® tablet, an electronic book, a navigation device, etc. The electronic system 200 includes at least one memory device 202. The at least one memory device 202 may include, for example, an embodiment of the memory structure 100 shown in FIGS. 1-8. The electronic system 200 may further include at least one electronic signal processor device 204 (often referred to as a "microprocessor"). The electronic signal processor device 204 may, optionally, include a memory structure substantially similar to an embodiment of the memory structure 100 shown in FIGS. 1-8. The electronic system 200 may further include one or more input devices 206 for inputting information into the electronic system 200 by a user, such as, for example, a mouse or other pointing device, a keyboard, a touchpad, a button, or a control panel. The electronic system 200 may further include one or more output devices 208 for outputting information (e.g., visual or audio output) to a user such as, for example, a monitor, a display, a printer, an audio output jack, a speaker, etc. In some embodiments, the input device 206 and the output device 208 may comprise a single touch screen device that can be used both to input information to the electronic system 200 and to output visual information to a user. The one or more input devices 206 and output devices 208 may communicate electrically with at least one of the memory device 202 and the electronic signal processor device 204.

Thus, in accordance with embodiments of the disclosure, an electronic system comprises a memory device in communication with at least one of an electronic signal processor device, an input device, and an output device. The memory device includes a memory structure comprising a first deck, common bit lines, and a second deck. The first deck comprises word lines between dielectric structures and extending in a first direction over portions of a base structure, storage element structures between the dielectric structures and extending in the first direction over the word lines, isolated electrode structures overlying portions of the storage element structures, and select device structures between additional dielectric structures and extending in a second direction perpendicular to the first direction. The common bit lines are located between the additional dielectric structures and extend in the second direction over the select device structures. The second deck comprises additional select device structures between the additional dielectric structures and extending in the second direction over the common bit lines, additional isolated electrode structures overlying portions of the additional select device structures, additional storage element structures extending in the first direction over the additional isolated electrode structures and portions of the additional dielectric structures, and additional word lines extending in the first direction over the additional storage element structures.

The methods of the disclosure facilitate the simple and cost-effective formation of a memory structure (e.g., the memory structure 100), such as a cross-point memory array. The methods of the disclosure may reduce the number of processing acts (e.g., masking and material removal acts), materials (e.g., photoresists, masking materials, etchants), and structures required to form a memory structure as compared to conventional methods of forming a memory structure. The methods of the disclosure may also reduce damage risks and/or material compatibility problems (e.g., damage risks and/or material compatibility problems associated with subtractive formation processes, such as plasma-etching-based processes) as compared to conventional methods of forming a memory structure. The methods and memory structures of the disclosure may facilitate improved device performance, reliability, and durability, lower costs, increased miniaturization of components, improved pattern quality, and greater packaging density as compared to conventional methods and conventional memory structures.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A memory structure, comprising:
   first conductive lines extending in a first direction over portions of a base structure;
   storage element structures extending in the first direction over the first conductive lines;
   isolated electrode structures overlying portions of the storage element structures;
   select device structures extending in a second direction perpendicular to the first direction over the isolated electrode structures;
   second conductive lines extending in the second direction over the select device structures;
   additional select device structures extending in the second direction over the second conductive lines;
   additional isolated electrode structures overlying portions of the additional select device structures;
   additional storage element structures extending in the first direction over the additional isolated electrode structures; and
   third conductive lines extending in the first direction over the additional storage element structures.

2. The memory structure of claim 1, further comprising:
   buffer structures between the first conductive lines and the storage element structures and extending in the first direction; and
   additional buffer structures between the additional storage element structures and the third conductive lines and extending in the first direction.

3. The memory structure of claim 2, wherein at least one of the buffer structures and the additional buffer structures comprise at least one of an ion reservoir material, a solid electrolyte ion conductor material, and an ion diffusion barrier material.

4. The memory structure of claim 2, wherein lower surfaces and opposing sidewalls of the additional buffer structures are surrounded by the additional storage element structures.

5. The memory structure of claim 1, further comprising dielectric structures extending in the first direction over other portions of the base structure and located laterally between the first conductive lines, the storage element structures, and the isolated electrode structures.

6. The memory structure of claim 5, further comprising additional dielectric structures extending in the second direction over portions of the dielectric structures and other portions of the storage element structures and located laterally between the isolated electrode structures, the select device structures, the second conductive lines, the additional select device structures, and the additional isolated electrode structures.

7. The memory structure of claim 1, wherein at least one of the storage element structures and the additional storage element structures comprises a resistance variable material.

8. The memory structure of claim 1, wherein at least one of the storage element structures and the additional storage element structures comprises an oxide material.

9. The memory structure of claim 1, wherein at least one of the storage element structures and the additional storage element structures comprises elevated peripheral portions and recessed central portions.

10. The memory structure of claim 1, wherein at least one of the storage element structures and the additional storage element structures comprise damascene structures.

11. The memory structure of claim 1, wherein lower surfaces and opposing sidewalls of the isolated electrode structures are surrounded by the storage element structures.

12. The memory structure of claim 1, wherein lower surfaces and opposing sidewalls of the third conductive lines are surrounded by the additional storage element structures.

13. A method of forming a memory structure, comprising:
   forming first conductive lines extending in a first direction within trenches located between dielectric structures overlying a base structure;
   forming storage element structures over the first conductive lines within the trenches;
   forming electrode structures over the storage element structures within the trenches;
   forming a material stack over the dielectric structures and the electrode structures, the material stack comprising a select device material, a conductive line material over the select device material, an additional select device material over the conductive line material, an electrode material over the additional select device material, and a masking material over the electrode material;
   forming openings through the material stack and the electrode structures to form isolated electrode structures, select device structures over portions of the dielectric structures and the isolated electrode structures, second conductive lines over the select device structures, additional select device structures over the second conductive lines, and additional electrode structures over the additional select device structures, the openings extending in a second direction perpendicular to the first direction;
   forming additional dielectric structures over other portions of the dielectric structures and the storage element structures within the openings;
   forming sacrificial structures over portions of the additional electrode structures and the additional dielectric structures, the sacrificial structures separated from one another by additional trenches extending in the first direction;
   forming additional storage element structures over other portions of the additional electrode structures and the additional dielectric structures within the additional trenches;
   forming third conductive lines over the additional storage element structures within the additional trenches; and
   removing the sacrificial structures and the portions of the additional electrode structures under the sacrificial structures to from additional isolated electrode structures.

14. The method of claim 13, further comprising:
   forming buffer structures between the first conductive lines and the storage element structures within the trenches; and
   forming additional buffer structures between the additional storage element structures and the third conductive lines within the additional trenches.

15. The method of claim 13, further comprising forming the storage element structures and the electrode structures substantially simultaneously.

16. The method of claim 15, wherein forming the storage element structures and the electrode structures substantially simultaneously comprises:
forming a storage element material over the first conductive lines and the dielectric structures;
forming a conductive material over storage element material; and
performing a polishing process to remove portions of the conductive material and the storage element material outside of the trenches.

17. The method of claim 13, wherein forming openings through the material stack and the electrode structures comprises removing portions of the material stack and the electrode structures without removing portions of the storage element structures underlying the portions of the material stack and the electrode structures.

18. The method of claim 13, wherein forming openings through the material stack and the electrode structures comprises forming the openings using a single photolithographic patterning process.

19. The method of claim 13, wherein forming sacrificial structures over portions of the additional electrode structures and the additional dielectric structures comprises:
forming a sacrificial material over additional electrode structures and the additional dielectric structures; and
forming the additional trenches in the sacrificial material.

20. The method of claim 13, further comprising forming the additional storage element structures and the third conductive lines substantially simultaneously.

21. The method of claim 20, wherein forming the additional storage element structures and the third conductive lines substantially simultaneously comprises:
forming a storage element material over the additional electrode structures, the additional dielectric structures, and the sacrificial structures;
forming a conductive material over storage element material; and
performing a polishing process to remove portions of the conductive material and the storage element material outside of the additional trenches.

22. The method of claim 13, further comprising forming further dielectric structures laterally between the isolated electrode structures, the additional storage element structures, the third conductive lines, and upper portions of the additional dielectric structures, the further dielectric structures extending over surfaces of the additional select device structures and the additional dielectric structures in the first direction.

23. A cross-point memory array, comprising:
a first deck comprising word lines extending in a first direction over a base structure, storage element structures extending in the first direction over the word lines, isolated electrode structures over the storage element structures, and select device structures extending in a second direction perpendicular to the first direction over the isolated electrode structures;
common bit lines extending in the second direction over the select device structures; and
a second deck comprising other select device structures extending in the second direction over the common bit lines, other isolated electrode structures over the other select device structures, other storage element structures extending in the first direction over the other isolated electrode structures, and other word lines extending in the first direction over the other storage element structures.

24. An electronic system, comprising:
a memory device in communication with at least one of an electronic signal processor device, an input device, and an output device, the memory device including a memory structure comprising:
a first deck comprising:
word lines between dielectric structures and extending in a first direction over portions of a base structure;
storage element structures between the dielectric structures and extending in the first direction over the word lines; and
isolated electrode structures overlying portions of the storage element structures;
select device structures between additional dielectric structures and extending in a second direction perpendicular to the first direction;
common bit lines between the additional dielectric structures and extending in the second direction over the select device structures; and
a second deck comprising:
additional select device structures between the additional dielectric structures and extending in the second direction over the common bit lines;
additional isolated electrode structures overlying portions of the additional select device structures;
additional storage element structures extending in the first direction over the additional isolated electrode structures and portions of the additional dielectric structures; and
additional word lines extending in the first direction over the additional storage element structures.

* * * * *